United States Patent [19]
Blomquist et al.

[11] Patent Number: 5,154,797
[45] Date of Patent: Oct. 13, 1992

[54] SILICON SHADOW MASK

[75] Inventors: Theodore V. Blomquist, Mt Airy; Bernard J. Rod, Potomac; Judith T. McCullen, Wheaton; Bohdan J. Dobriansky, Bethesda, all of Md.

[73] Assignee: The United States of America as represented by the Secretary of the Army, Washington, D.C.

[21] Appl. No.: 746,025

[22] Filed: Aug. 14, 1991

[51] Int. Cl.$^5$ .................. H01L 2/306; B44C 1/22; C03C 15/00; C03C 25/06

[52] U.S. Cl. .................. 156/644; 118/721; 118/504; 156/645; 156/657; 156/659.1; 156/662; 156/633; 204/298.11; 428/134; 428/137

[58] Field of Search ............... 156/636, 637, 645, 644, 156/653, 654, 657, 659.1, 662, 633; 428/131, 134, 137, 138; 118/720, 721, 301, 504; 204/192.1, 298.11; 427/248.1, 282, 294

[56] References Cited

U.S. PATENT DOCUMENTS

| | | | |
|---|---|---|---|
| 3,713,922 | 1/1973 | Lepselter et al. | 156/16 |
| 3,770,533 | 11/1973 | Zwicker | 156/644 |
| 4,256,532 | 3/1981 | Magdo et al. | 156/628 |
| 4,391,034 | 7/1983 | Stuby | 29/579 |
| 4,401,367 | 8/1983 | Grantham et al. | 350/162.22 |
| 4,419,182 | 12/1983 | Westerberg | 156/644 |
| 4,919,749 | 4/1990 | Mauger et al. | 156/643 |
| 4,941,942 | 7/1990 | Bruns et al. | 156/657 |

OTHER PUBLICATIONS

Bassous, "Fabrication of Novel Three-Dimensional Microstructures by the Anisotropic Etching of (100) and (110) Silicon," IEEE Transactions on Electron Devices, vol. ED-25, No. 10, Oct. 1978 pp. 1178-1185.

Primary Examiner—William A. Powell
Attorney, Agent, or Firm—Saul Elbaum; Jason M. Shapiro

[57] ABSTRACT

A shadow mask for sputtering is formed from a single crystal silicon wafer which is mechanically and chemically polished to produce top and bottom surfaces which are substantially flat and parallel to one another. The wafer is provided with one or more pyramidal etch pits which are arranged in a pattern. Each pit has a substantially square cross-section on the top surface, and a smaller substantially square cross-section on the bottom surface to produce an aperture in the wafer. In use, the wafer is clamped against a flat substrate with its apertures opening toward the evaporant beam. After use, the deposited species may be cleaned from the wafer using suitable etchants which render the wafer unharmed, and therefore reusable.

10 Claims, 3 Drawing Sheets

SILICON SHADOW MASK

GOVERNMENTAL INTEREST

The invention described herein may be manufactured, used and licensed by or for the U.S. Government for governmental purposes without the payment to us of any royalties thereon.

BACKGROUND OF THE INVENTION

This invention relates to a masking device and a method therewith for defining a high resolution thin film pattern on a flat substrate by vacuum deposition or sputtering.

Most commonly used methods for generating high resolution thin film patterns on substrates make use of physical barriers, or masks, which are in close proximity to the substrate during film deposition. Apertures cut or etched into the mask allow portions of the evaporant beam to intercept and condensate upon the exposed regions of the substrate.

In order to produce sharply delineated film patterns, it is necessary that the mean free path of the evaporant particles be long compared to the mask to substrate spacing, and that the sticking coefficient of the evaporant beam be close to unity to prevent seepage under the mask. If the mask is in physical contact with the substrate, and the substrate is maintained at a relatively low temperature, it is possible to achieve good results. This is not the case with sputtering, however, because of the higher gas pressure and temperature. Physical contact is particularly important in sputtering systems since the evaporant particles are imparted considerable kinetic energy, allowing them to penetrate under the prior art masks. Therefore, sharp film patterns have not been obtainable by sputtering.

In the past, masks of metal foil, graphite, and glass have been used. These, however, have suffered from a number of problems owing to the materials themselves and the methods used in their manufacture. Patterns smaller than a few thousandths of an inch cannot be achieved accurately and repeatably, and because these masks must be thin to accommodate high resolution patterns they are typically not stiff enough to maintain good physical contact with the substrate. Furthermore, where thicker masks are used, machining and etching techniques have produced apertures having side walls substantially normal to the face of the mask, allowing deposited material to accumulate in and clog the aperture without contacting the substrate. See generally, Maissel & Glang, *Handbook of Thin Film Technology*, McGraw-Hill 7-1 to 7-7 (1970).

In addition, cleaning techniques capable of removing the evaporated species from a mask generally attack the mask itself, rendering it unusable. U.S. Pat. No. 4,391,034 (1983), issued to Stuby, suggests the use of a molybdenum mask to satisfy a long felt need in the art for reusable masks. While molybdenum may be hardier than other metals, and therefore more suitable for sputtering applications, its use still limits pattern resolution. Stuby also recognizes that masks and substrates generally have different coefficients of thermal expansion.

U S. Pat. No. 4,256,532 (1981), issued to Magdo et al., proposes a silicon shadow mask for use with silicon substrates to overcome thermal expansion problems during deposition. Magdo's apertures are etched in such a way as to purposefully limit lateral growth, resulting in substantially vertical side walls. In addition, the resulting slightly tapered aperture is oriented so that its smaller cross-section faces the evaporant beam, not the substrate. While this may assist the user in lifting-off the mask after deposition, it frustrates the attainment of maximum resolution which is of primary importance to the users of masks, and it does not solve the problems associated with aperture clogging and seepage under the mask.

SUMMARY OF THE INVENTION

Accordingly, it is an object of the present invention to provide a reusable masking device for defining high resolution patterns on flat substrates by deposition and sputtering.

It is another object of the present invention to provide a reusable masking device which will maintain good physical contact with a flat surface during deposition and sputtering applications to prevent migration of the deposited particles beneath the mask.

It is yet another object of the present invention to provide a reusable masking device with tapered apertures to prevent deposited particles from accumulating in and clogging said apertures and to achieve higher pattern resolution and delineation.

In accordance with the present invention, there is provided a method for producing a deposited pattern of material on a flat substrate with a reusable mask.

In addition, there is provided a method for producing a deposited pattern of material on a flat substrate in an economical way with a reusable mask having tapered apertures, wherein the apertures are etched by conventional techniques, and the necessity for photomask-crystallographic alignment is lessened through the use of circular openings in the photomask.

These objects and others not specifically enumerated are accomplished with a single crystal silicon wafer having top and bottom surfaces which are mechanically and chemically polished rendering them substantially flat and parallel to one another. The wafer is provided with one or more pyramidal etch pits which are arranged in a pattern. Each pit has a substantially square cross-section on the top surface, and a smaller substantially square cross-section on the bottom surface to produce an aperture in the wafer. In use, the wafer is clamped against a flat substrate with its apertures opening toward the evaporant beam. After use, the deposited species may be cleaned from the wafer using suitable etchants which render the wafer unharmed, and therefore reusable.

BRIEF DESCRIPTION OF THE DRAWINGS

The preferred embodiments of the present invention will be described with reference to the accompanying drawings.

DESCRIPTION OF THE PREFERRED EMBODIMENTS

Prior art shadow masks have been unable to produce deposition patterns smaller than a few thousandths of an inch, and in sputtering applications it has been impossible to achieve adequate pattern delineation. This is due, in large part, to the fact that in order to achieve high resolution, prior art masks have to be made thinner, but in so doing they become less rigid. As a result, it is difficult to maintain proper contact with the substrate during sputtering. The present invention overcomes these difficulties, plus it offers reusability and thermal compensation (when used with silicon substrates).

Figure 1:
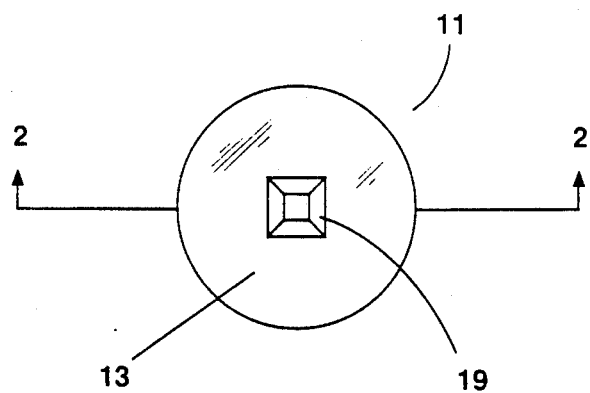
FIG. 1 is a top view of the silicon shadow mask.
Figure 2:
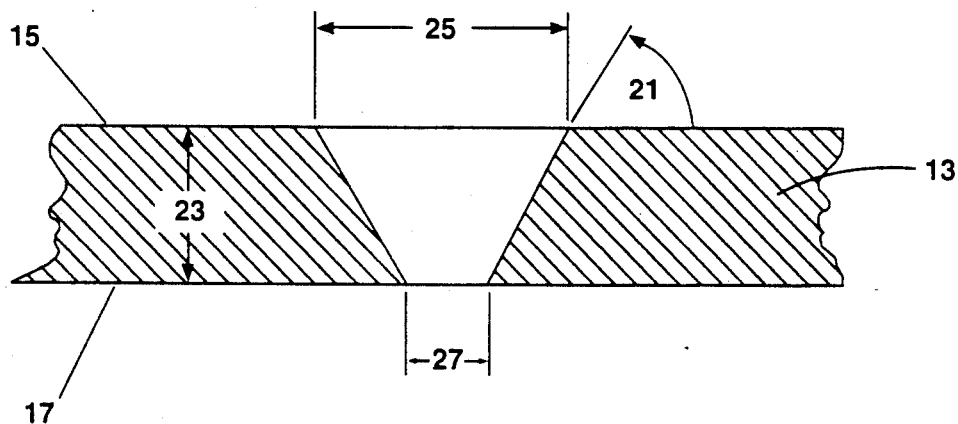
FIG. 2 is a cross-sectional view of the silicon shadow mask showing the aperture geometry.
Figure 3:
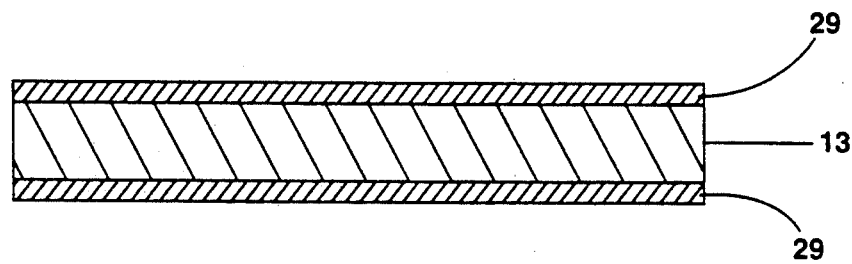
FIG. 3 is a cross-sectional view of a polished silicon wafer after an oxide layer has been grown.
Figure 4:
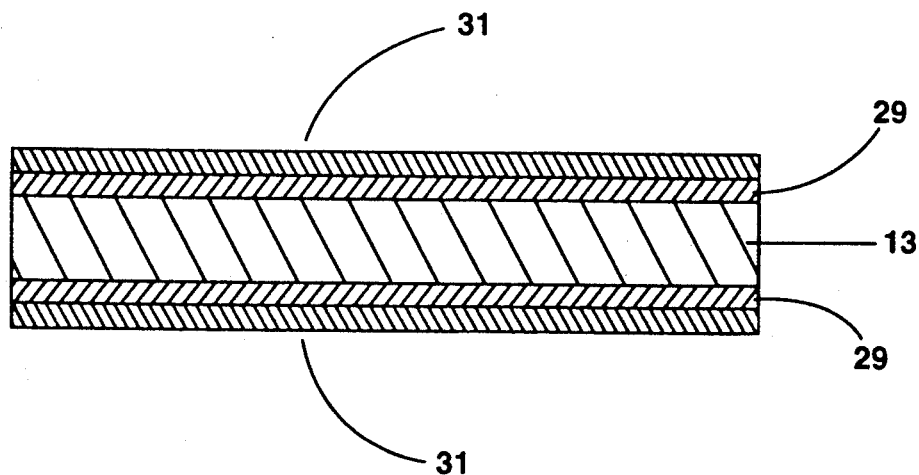
FIG. 4 is a cross-sectional view of a polished silicon wafer after an oxide layer has been grown and a layer of photoresist has been distributed.
Figure 5:
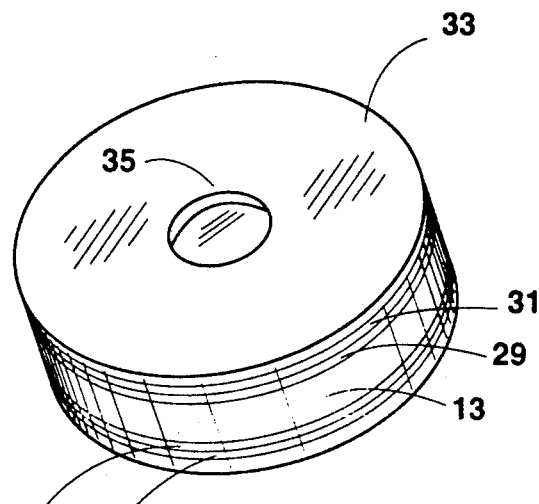
FIG. 5 is an isometric view of the silicon wafer and photomask with circular aperture.
Figure 6:
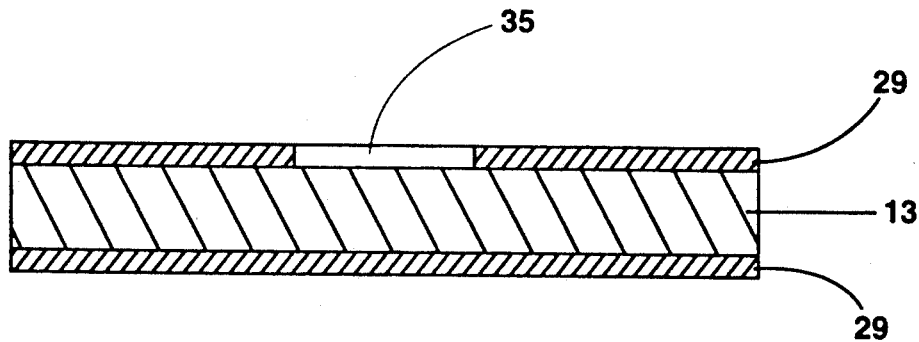
FIG. 6 is a cross-sectional view of the silicon wafer and etched oxide layer with photoresist layer removed.
Figure 7:
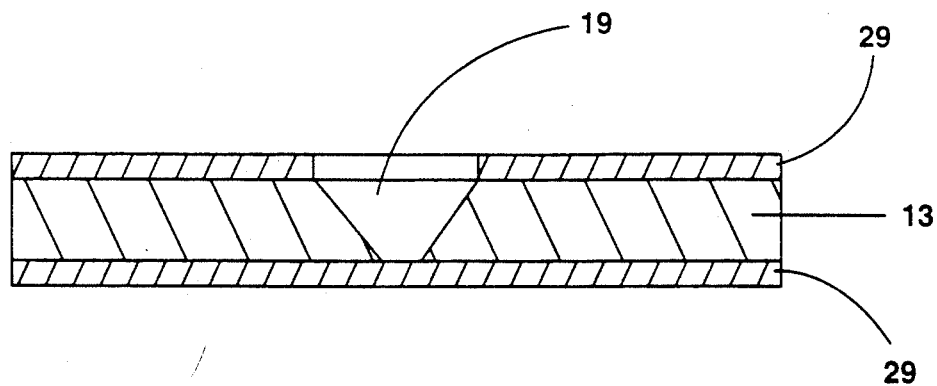
FIG. 7 is a cross-sectional view of the etched silicon wafer prior to removal of the oxide layer.
Figure 8:
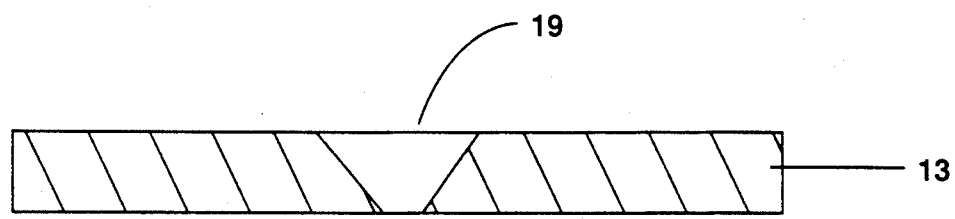
FIG. 8 is a cross-sectional view of the etched silicon wafer.
Figure 9:
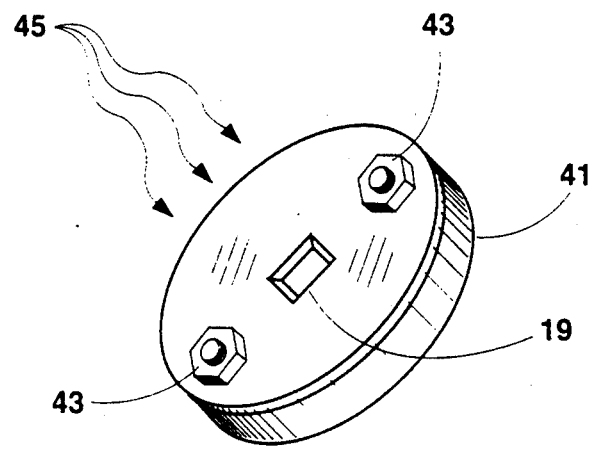
FIG. 9 is a cross-sectional view of the silicon shadow mask in use

Referring now to FIGS. 1 and 2, a silicon shadow mask 11 is fabricated from a commercially available single crystal silicon wafer 13 which has been mechanically and chemically polished on top and bottom surfaces 15 and 17, rendering them substantially flat and parallel to one another. In a preferred embodiment, the surface roughness of the top and bottom surfaces 15 and 17, is held to within 100 Angstroms. The diameter of the silicon wafer 13 must be large enough to accommodate the desired pattern while allowing the wafer 13 to be clamped to a flat substrate (not illustrated). A wafer 13 having a thickness 23 of between 0.001 and 0.010 inches may be used, but for optimal strength, economy, and ease of fabrication a wafer 13 having a thickness 23 of between 0.002 and 0.005 inches is preferred.

The crystallographic orientation of the single crystal wafer 13 should be such that its <100> axis is substantially normal to top and bottom surfaces 15 and 17. Preferential etching of the top face 15 produces pyramidal apertures 19 such as the one illustrated in FIG. 1. Each aperture 19 is essentially an etch pit which has been allowed to penetrate through the wafer 13 producing a tapered opening 19 (or aperture) in the mask 11. The degree of taper 21 is typically 54.7°, which is a consequence of the chosen orientation, and thus allows the user to benefit from all the advantages of a tapered opening while maintaining economy through the use of inexpensive and simple etching techniques. It is possible to relate the minimum resolution of the mask as characterized by the dimension 27 (corresponding to the square opening on the bottom surface of the wafer) and the dimensions of the square opening on the top surface of the wafer 25. This is given by:

$$R = x - 1.416t$$

where R is the length of one side of the bottom opening 27, x is the length of one side of the top opening 25 (and also the size of a pattern feature in the photomask used in creating the etch pit), and t is the thickness 23 of the silicon wafer. For example, if the wafer 13 is 0.002 inches thick, and a photomask with 0.005 inch pattern features is used in creating an etch pit 19 in the wafer 13, the resulting shadow mask 11 will be able to create pattern features of about 0.002 inches.

Tapered apertures 19 serve a two-fold purpose. First, they allow the silicon mask 11 to offer greater resolution than the photomask used in fabricating it. Secondly, they assist in collecting the sputtered particles, and prevent blockage of the apertures, which is common to prior art masks of the same or greater thickness and which employ vertical (non-tapered) openings. Also, by polishing both top and bottom surfaces 15, 17 of the wafer 13, better contact can be made between the mask 11 and a substrate, preventing seepage under the mask 11. This results in superior pattern delineation.

In practice, a single crystal silicon wafer 13, as described above, is mechanically and chemically polished, and then cleaned using conventional techniques. As illustrated in FIGS. 3-9 a thin (1000-5000 Angstroms) layer of $SiO_2$ 29 is grown on one or both sides of the wafer 13 in an oven at 900-1200° C. In one embodiment, a 1000-5000 Angstrom layer of $Si_3N_4$ is deposited atop the $SiO_2$ layer 29. A layer of photoresist 31 is then distributed on one or both sides of the wafer 13, usually by spinning. The photoresist 31 is selectively masked with a photomask 33, which is provided with circular apertures 35. The use of circular apertures 35 was discovered to be an economical and efficient means for locating etch sites. Apertures corresponding to the shape of the desired etch pits were more difficult to fabricate and align. The circular apertures 35 create pyramidal etch pits 19 with square openings on top and bottom surfaces 15 and 17. The length of one side of a square opening on the top surface 15, is equal to the diameter of the circular aperture 35 used.

After the photoresist 31 is selectively covered by the photomask 33, the assembly is exposed to light. When the photomask 33 is removed and the photoresist 31 is developed, a pattern of circular holes 37 will appear in the layer of photoresist 31, exposing circular regions of the $SiO_2$ layer 29. At this point the photoresist 31 is hardened, and the wafer assembly is bathed in a suitable etchant to remove $SiO_2$ 29 at the exposed sites, thereby creating circular holes 39 in the $SiO_2$ layer 29. If a layer of $Si_3N_4$ has been deposited atop the $SiO_2$ layer 29, a dry etching technique may be used. The hardened photoresist 31 may be removed following this procedure, but in most instances it will not survive subsequent processing steps.

The wafer is then bathed in a silicon etchant, such as potassium hydroxide (KOH), to produce pyramidal apertures 19 through the thickness of the silicon wafer 13. When a suitable aperture 19 is achieved, the wafer is removed from the etchant, and the $SiO_2$ layer 29 is removed using buffered hydrofluoric acid, or another suitable etchant. If a layer of $Si_3N_4$ has been deposited, dry etching, or possibly phosphoric acid, may be used to remove it.

The finished mask 11 is placed on a flat substrate 41 and held down with clamps 43. The tapered apertures 19 open toward the evaporant beam 45 so that sputtered particles are collected from the maximum cross-section possible, and directed down toward the opening in the bottom surface of the mask where they are deposited. Because the mask 11 is highly polished, there is little or no seepage between the bottom surface of the mask 17 and the substrate 41.

After deposition of the pattern, the mask 11 may be removed from the substrate 41, and the deposited species may be cleaned from the mask 11 using appropriate etchants which attack the species, but not the mask 11.

While there has been described and illustrated specific embodiments of the invention, it will be obvious that various changes, modifications and additions can be made herein without departing from the field of the invention which should be limited only by the scope of the appended claims.

We claim:

1. A reusable masking device for defining high resolution patterns on flat substrates, said device comprising:
   a single crystal silicon wafer having top and bottom surfaces which are mechanically and chemically polished rendering them substantially flat and parallel to one another, and wherein said wafer is provided with a <100> crystallographic orientation substantially normal to said top and bottom surfaces;
   one or more pyramidal etch pits arranged in a pattern, said etch pits having side walls which are oriented at 54.7° relative to top and bottom surfaces of said wafer, each of said pits penetrating said top and bottom surfaces to produce an aperture having a substantially square cross-section on the top surface, and a smaller substantially square cross-section on the bottom surface;
   means to attach said wafer to a flat substrate, such that the bottom surface of said wafer is in intimate contact with the substrate, and material passing through the silicon wafer by means of said aperture or apertures will collect on the substrate without seeping between the wafer and substrate, thereby defining a high resolution pattern on the substrate;
   means to remove said wafer from said substrate without destructive effect, thereby allowing said wafer to be reused.

2. The invention of claim 1 wherein the bottom surface of said wafer has a surface roughness of less than 100 Angstroms.

3. The invention of claim 1 wherein the top and bottom surfaces of said wafer have a surface roughness of less than 100 Angstroms.

4. The invention of claim 1 wherein said wafer has a thickness of between 0.001 and 0.010 inches.

5. A method for producing a deposited pattern of material on a flat substrate, said method comprising the steps of:
   (a) positioning a silicon mask against a flat substrate, said mask having top and bottom surfaces which are mechanically and chemically polished rendering them substantially flat and parallel to one another, said mask further provided with one or more pyramidal etch pits having tapered sides and arranged in a pattern, wherein the tapered sides of the pyramidal pit or pits intersect the top and bottom surfaces of said mask at an angle of 54.7° to form an aperture having a substantially square cross-section on said top surface, and a smaller substantially square cross-section on said bottom surface, the tapered sides preventing the accumulation of material through the thickness of said mask and blockage of said aperture or apertures therefrom;
   (b) clamping said silicon mask so that the bottom face of the mask is in intimate contact with the substrate, thereby preventing seepage of material between the mask and the substrate;
   (c) depositing a film of material onto said mask and through said aperture or apertures;
   (d) unclamping said mask from the substrate;
   (e) removing said mask from the substrate.

6. The method of claim 5 including the step of cleaning the mask after its removal so as to render it reusable.

7. A method for producing a deposited pattern of material on a flat substrate, said method comprising the steps of:
   (a) obtaining a single crystal silicon wafer having top and bottom surfaces which are mechanically and chemically polished rendering them substantially flat and parallel to one another, said wafer further provided with a <100> crystallographic orientation normal to said top and bottom surfaces;
   (b) growing an oxide layer on one or both sides of said wafer;
   (c) distributing a layer of photoresist to one or both sides of said wafer and soft-baking;
   (d) applying a photomask to the top surface of said wafer, wherein said photomask is provided with one or more circular apertures arranged in a pattern;
   (e) exposing the top surface of said wafer to light;
   (f) developing the photoresist;
   (g) hardening the photoresist;
   (h) bathing the wafer in a suitable etchant to remove exposed portions of said oxide layer;
   (i) bathing the wafer in a preferential silicon etchant to produce pyramidal etch pits at one or more sites on the top surface of the wafer corresponding to said pattern of circular apertures;
   (j) removing said wafer from the silicon etchant when said etch pits extend from the top surface of said wafer to the bottom surface of said wafer, and a suitable aperture or apertures has/have been produced in the silicon wafer having a substantially square cross-section at said top surface, and a smaller substantially square cross-section at said bottom surface, said aperture or apertures further having tapered sides which intersect said top and bottom surfaces at an angle of 54.7°;
   (k) removing the remaining oxide layer from top and bottom surfaces of said wafer;
   (l) positioning said wafer against a flat substrate;
   (m) clamping said wafer so that the bottom face of the wafer is in intimate contact with the substrate, thereby preventing seepage of material between the wafer and the substrate;
   (n) depositing a film of material onto said wafer and through said aperture or apertures;
   (o) unclamping said wafer from the substrate;
   (p) removing said wafer from the substrate.

8. The method of claim 7 wherein a layer of $Si_3N_4$ is deposited on the wafer after the oxide layer has been grown, and a suitable etchant is used to remove the exposed portions of the $Si_3N_4$ layer subsequent to hardening of the photoresist layer, and again after preferential etching of the silicon wafer.

9. The method of claims 7 or 8 including the step of cleaning the wafer after its removal so as to render it reusable.

10. The method of claim 5, 7, or 8 where a film of material is sputtered onto said mask and through said aperture or apertures.

* * * * *